United States Patent
Katayama (10) Patent No.: US 8,675,400 B2
(45) Date of Patent: Mar. 18, 2014

(54) MAGNETIC MEMORY

(75) Inventor: Akira Katayama, Yamato (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 346 days.

(21) Appl. No.: 13/234,237

(22) Filed: Sep. 16, 2011

(65) Prior Publication Data

US 2012/0069641 A1 Mar. 22, 2012

(30) Foreign Application Priority Data

Sep. 22, 2010 (JP) ................................. 2010-212630

(51) Int. Cl.
*G11C 11/00* (2006.01)

(52) U.S. Cl.
USPC ........... 365/158; 365/148; 365/171; 977/933; 977/935

(58) Field of Classification Search
USPC ......... 365/48, 55, 62, 66, 74, 78, 80–93, 100, 365/130, 131, 148, 158, 171–173, 209, 213, 365/225.5, 230.07, 232, 243.5; 216/22; 257/295, 421, 422, 427, E21.665, 257/E27.006; 438/3; 428/810–816, 428/817–825.1, 826; 977/933–935
See application file for complete search history.

(56) References Cited

U.S. PATENT DOCUMENTS

| | | | | |
|---|---|---|---|---|
| 6,831,314 B2 * | 12/2004 | Higo et al. | ...................... | 257/295 |
| 6,879,473 B2 * | 4/2005 | Sone et al. | ............... | 360/324.12 |
| 6,992,868 B2 * | 1/2006 | Sone et al. | ............... | 360/324.12 |
| 6,999,288 B2 * | 2/2006 | Sone et al. | ............... | 360/324.12 |
| 7,026,671 B2 * | 4/2006 | Mizuguchi et al. | ............ | 257/295 |
| 7,378,699 B2 * | 5/2008 | Hayakawa | ...................... | 257/295 |
| 7,851,840 B2 * | 12/2010 | Diao et al. | ...................... | 257/295 |
| 2004/0001372 A1 * | 1/2004 | Higo et al. | ...................... | 365/200 |
| 2004/0042129 A1 * | 3/2004 | Mizuguchi et al. | ........ | 360/324.2 |
| 2004/0246788 A1 * | 12/2004 | Sone et al. | ...................... | 365/200 |
| 2005/0162904 A1 * | 7/2005 | Sone et al. | ...................... | 365/158 |
| 2005/0162905 A1 * | 7/2005 | Sone et al. | ...................... | 365/158 |
| 2006/0125034 A1 * | 6/2006 | Ohba et al. | ...................... | 257/421 |
| 2006/0187703 A1 * | 8/2006 | Mizuguchi et al. | ........... | 365/158 |
| 2008/0061388 A1 * | 3/2008 | Diao et al. | ...................... | 257/421 |

FOREIGN PATENT DOCUMENTS

JP 2009-99625 5/2009

OTHER PUBLICATIONS

T. Inaba, et al, "Resistance Ratio Read ($R^3$) Architecture for a Burst Operated 1.5V MRAM Macro", IEEE 2003 Custom Integrated Circuits Conference, IEIC Technical Report, vol. 103 No. 510, 4 pages.

* cited by examiner

*Primary Examiner* — Harry W Byrne
(74) *Attorney, Agent, or Firm* — Oblon, Spivak, McClelland, Maier & Neustadt, L.L.P.

(57) ABSTRACT

According to one embodiment, a magnetic memory includes a magnetoresistive element includes a first reference layer, a first nonmagnetic layer, a recording layer, a second nonmagnetic layer, and a second reference layer which are sequentially stacked, the recording layer being connected to a terminal to which a high-level voltage is applied, a magnetization direction of the recording layer being variable, magnetization directions of the first and second reference layers being invariable and antiparallel, a first selection transistor connected between a first bit line and the first reference layer, and constituted of an N-channel MOSFET, a second selection transistor connected between a second bit line and the second reference layer, and constituted of an N-channel MOSFET, and a word line connected to gates of the first and second selection transistors.

16 Claims, 7 Drawing Sheets

FIG. 10A  "0" write

FIG. 10B  "1" write

MAGNETIC MEMORY

CROSS-REFERENCE TO RELATED APPLICATIONS

This application is based upon and claims the benefit of priority from prior Japanese Patent Application No. 2010-212630, filed Sep. 22, 2010, the entire contents of which are incorporated herein by reference.

FIELD

Embodiments described herein relate generally to a magnetic memory.

BACKGROUND

In recent years, with the achievement of high integration of a semiconductor integrated circuit, and reduction in the power-supply voltage, the deficiency in the operation margin of a magnetic random access memory (MRAM) utilized in a semiconductor integrated circuit becomes a problem. In the MRAM, a magnetic tunnel junction (MTJ) element having two magnetic layers, and a nonmagnetic layer interposed between these magnetic layers is used as a storage element. The MTJ element stores therein 1-bit data in accordance with whether the magnetization arrangement states of the two magnetic layers are parallel with each other or antiparallel with each other.

DETAILED DESCRIPTION

A magnitude of a current differs between a case where the MTJ element is kept in a parallel state, and a case where the MTJ element is kept in an antiparallel state, and the time required for data write also largely differs between the above cases. Accordingly, if a selection transistor configured to supply a write current to the MTJ element has variations in its characteristics, a state occurs where the current value is insufficient when a large write current is made to flow, and write to the MTJ element cannot be carried out.

Further, when data is read from the MTJ element, the single-ended read method is used. However, the single-ended read method is subject to fluctuations in the power-supply voltage or influence of signal line noise, and the read margin becomes small.

In general, according to one embodiment, there is provided a magnetic memory comprising:
a magnetoresistive element comprising a first reference layer, a first nonmagnetic layer, a recording layer, a second nonmagnetic layer, and a second reference layer which are sequentially stacked, the recording layer being connected to a terminal which a high-level voltage is applied, a magnetization direction of the recording layer being variable, magnetization directions of the first and second reference layers being invariable and antiparallel;
a first selection transistor connected between a first bit line and the first reference layer, and constituted of an N-channel MOSFET;
a second selection transistor connected between a second bit line and the second reference layer, and constituted of an N-channel MOSFET; and
a word line connected to gates of the first and second selection transistors.

The embodiments will be described hereinafter with reference to the accompanying drawings. In the description which follows, the same or functionally equivalent elements are denoted by the same reference numerals, to thereby simplify the description.

First Embodiment

Figure 1:
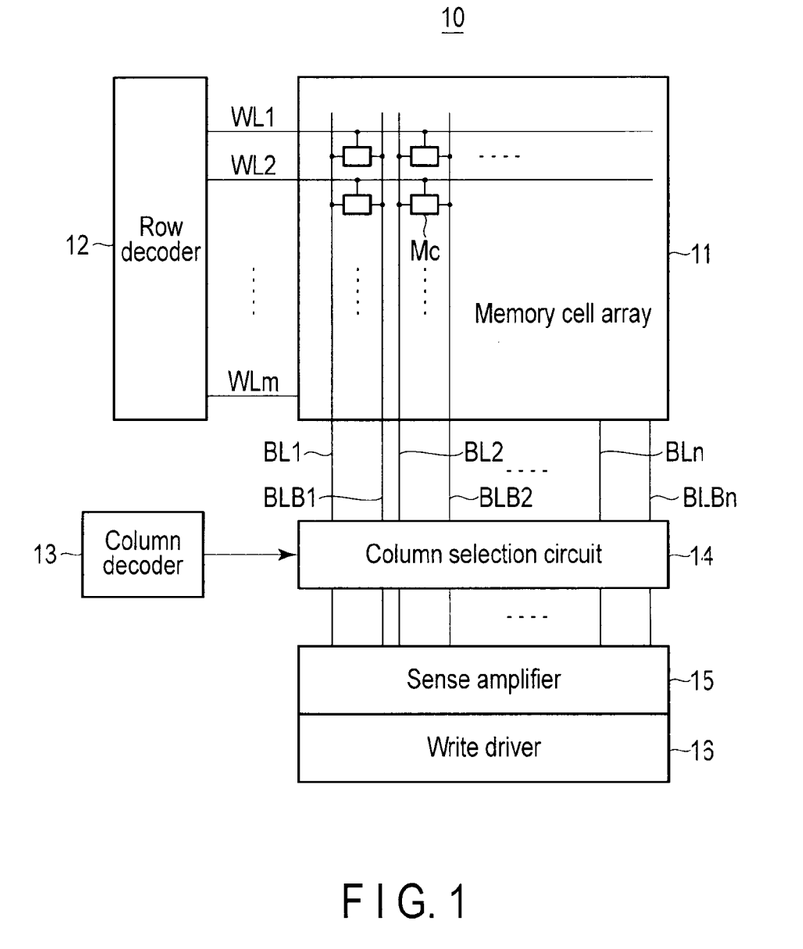
FIG. 1 is a block diagram showing the configuration of an MRAM 10 according to a first embodiment.

FIG. 1 is a block diagram showing the configuration of a magnetic memory (MRAM) 10 according to a first embodiment. The MRAM 10 comprises 3 memory cell array 11, row decoder 12, column decoder 13, column selection circuit 14, sense amplifier 15, and write driver (write circuit) 16.

The memory cell array 11 comprises a plurality of memory cells MC arranged in a matrix form. In the memory cell array 11, a plurality of word lines WL1 to WLm extending in the row direction, and a plurality of bit line pairs BL1 and BLB1 to BLn and BLBn extending in the column direction are arranged.

The row decoder 12 is connected to the plurality of word lines WL1 to WLm. The row decoder selects one of the plurality of word lines WL1 to WLm on the basis of a row address signal.

The column selection circuit 14 is connected to the plurality of bit line pairs BL1 and BLB1 to BLn and BLBn. The column decoder 13 is connected to the column selection circuit 14. The column decoder 13 generates a column selection signal on the basis of a column address signal, and the column selection signal is sent to the column selection circuit 14. The column selection circuit 14 selects, for example, one pair of the plurality of bit line pairs BL1 and BLB1 to BLn and BLBn on the basis of the column selection signal. It should be noted that a predetermined number of bit line pairs connected to a common word line may be simultaneously selected. In this case, a read operation or a write operation is executed for the predetermined number of bit line pairs.

The sense amplifier 15 and write driver 16 are connected to the plurality of bit line pairs BL1 and BLB1 to BLn and BLBn through the column selection circuit 14. At the time of data read, the sense amplifier 15 reads data from a selected memory cell MC by detecting a voltage or a current of the selected bit line pair BL and BLB. At the time of data write, the write driver 16 supplies a write current to the selected memory cell MC, and writes data to the selected memory cell MC.

Figure 2:
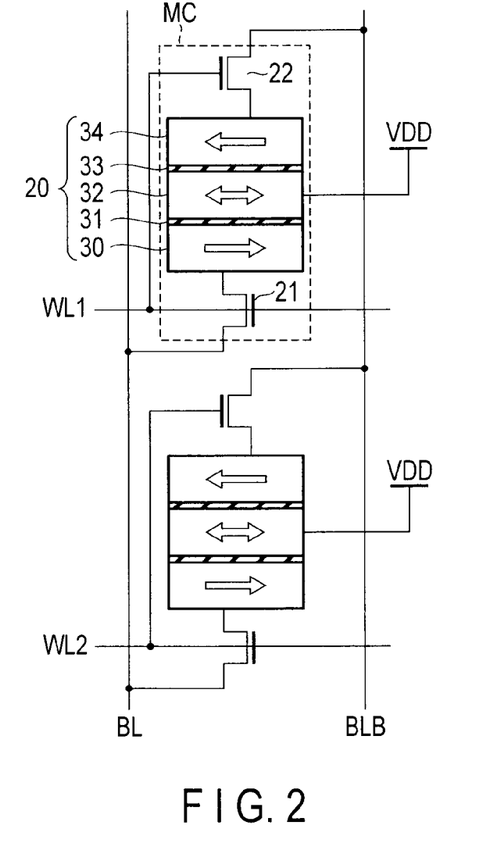
FIG. 2 is a circuit diagram showing the configuration of a memory cell MC.

Next, the configuration of the memory cell MC will be described below. FIG. 2 is a circuit diagram showing the configuration of the memory cell MC. The memory cell comprises one MTJ element (magnetoresistive element) 20, and two selection transistors 21 and 22.

The MTJ element 20 is constituted of, in the order from the bottom, a first reference layer (also referred to as a fixed layer) 30, first nonmagnetic layer 31, recording layer (also referred to as a free layer) 32, second nonmagnetic layer 33, and second reference layer 34, all of which are stacked.

The recording layer 32 is constituted of a ferromagnetic material, and the direction of easy magnetization thereof is parallel with, for example, the film surface. It should be noted that the direction of easy magnetization may also be perpendicular to the film surface. In the recording layer 32, the direction of magnetization (or spin) is variable (reversible).

Each of the first reference layer 30, and second reference layer 34 is constituted of a ferromagnetic material, and the direction of easy magnetization thereof is identical to that of the recording Layer 32. In the first reference layer 30, and second reference layer 34, the magnetization directions are invariable, and the magnetization directions are set antiparallel with each other.

The first reference layer 30, and second reference layer 34 are set in such a manner that the layers 30 and 34 each have a magnetic anisotropy energy sufficiently greater than the recording layer 32. Setting of the magnetic anisotropy is enabled by adjusting the material configuration or the film thickness. In this manner, the magnetization reversal current of the recording layer 32 is made small, and the magnetization reversal current of each of the first reference layer 30 and second reference layer 34 is made greater than that of the recording layer 32. Thereby, it is possible to realize an MTJ element 20 provided with a recording layer 32 the magnetization direction of which is variable, and reference Layers 30 and 34 the magnetization directions of which are invariable.

As the first nonmagnetic layer 31 and second nonmagnetic layer 33, a nonmagnetic metal, nonmagnetic semiconductor, insulator, and the like can be used. When an insulator is used as the nonmagnetic layer 31 or 33, the nonmagnetic layer 31 or 33 is called a tunnel barrier layer, and when a metal is used as the layer 31 or 33, the layer 31 or 33 is called a spacer layer.

In a general magnetoresistive element, a laminated body constituted of two magnetic layers, and one nonmagnetic layer interposed between these magnetic layers develops the magnetoresistive effect. When the magnetization directions of the two magnetic layers are parallel with each other, the resistance value of the magnetoresistive element becomes the lowest, aid when the magnetization directions of the two magnetic layers are antiparallel with each other, the resistance value of the magnetoresistive element becomes the highest. Accordingly, in the MTJ element 20 of this embodiment, a first laminated body constituted of the first reference layer 30, first nonmagnetic layer 31, and recording layer 32 develops the magnetoresistive effect, and a second laminated body constituted of the recording layer 32, second nonmagnetic layer 33, and second reference layer 34 develops the magnetoresistive effect. Further, in the first laminated body, when the magnetization directions of the first reference layer 30, and recording layer 32 are parallel with each other, the resistance value thereof becomes the lowest, and when the magnetization directions of the first reference layer 30, and recording layer 32 are antiparallel with each other, the resistance value thereof becomes the highest. Likewise, in the second laminated body, when the magnetization directions of the second reference layer 34, and recording layer 32 are parallel with each other, the resistance value thereof becomes the lowest, and when the magnetization directions of the second reference layer 34, and recording layer 32 are antiparallel with each other, the resistance value thereof becomes the highest.

As each of the selection transistors 21 and 22, an N-channel metal oxide semiconductor field effect transistor (MOSFET) is used. A gate of the selection transistor 21 is electrically connected to a word line WL, a source thereof is electrically connected to a bit line BL, and a drain thereof is electrically connected to the second reference layer 34. Furthermore, the recording layer 32 is electrically connected to the power-supply terminal to which a high-level voltage (for example, the power-supply voltage VDD) is supplied.

Figure 3A:
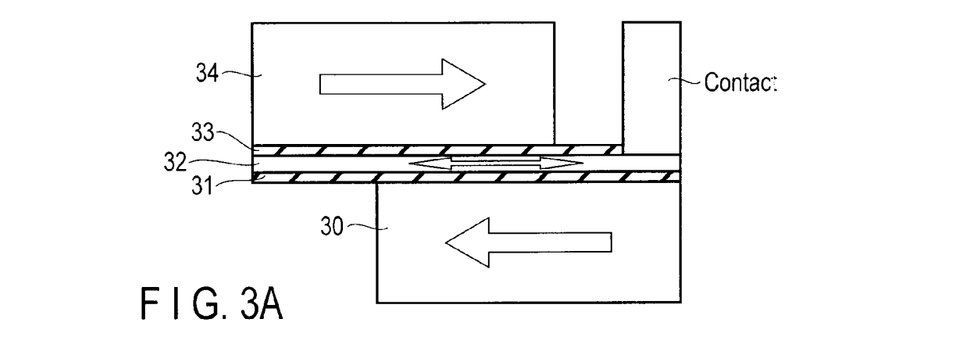
FIGS. 3A, 3B and 3C are views for explaining a contact connected to a recording layer.
Figure 3B:
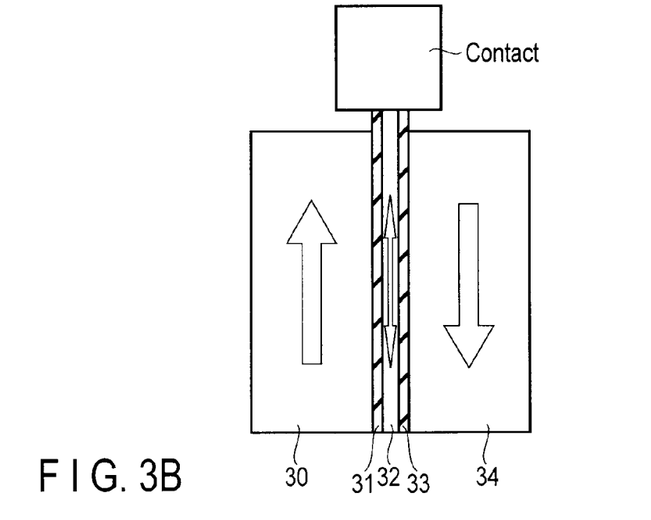
Figure 3C:
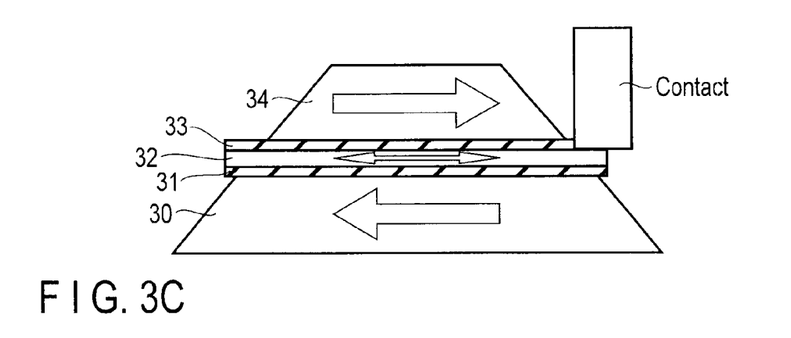

As shown in FIGS. 3A to 3C, for example, the recording layer 32 is electrically connected to the power-supply terminal via a contact. In FIG. 3A, the first reference layer 30 is shifted from the second reference layer 34 in X-direction. The recording layer 32 is sandwiched between the first reference layer 30 and the second reference layer 34. The contact is formed on a portion of the recording layer 32, which is not covered by the second nonmagnetic layer 33. Via the contact of FIG. 3A, the recording layer 32 is electrically connected to the power-supply terminal.

In FIG. 3B, a width of each of the first nonmagnetic layer 31, the recording layer 32 aid the second nonmagnetic layer 33 is longer than a width of each of the first reference layer 30 and the second reference layer 34. The contact is formed on side surfaces of the first nonmagnetic layer 31, the recording layer 32 and the second nonmagnetic layer 33. Via the contact of FIG. 3B, the recording layer 32 is electrically connected to the power-supply terminal.

In FIG. 3C, a cross section of each of the first reference layer 30 and the second reference layer 34 have a trapezoidal shape. The contact is formed on an end portion of the recording layer 32, which is not covered by the second nonmagnetic layer 33. Via the contact of FIG. 3C, the recording layer 32 is electrically connected to the power-supply terminal.

(Operation)

Next, a write operation of the MRAM 10 will be described below. In the magnetoresistive element configured in such a manner that the nonmagnetic layer is interposed between the two magnetic layers, a first write current configured to carry out write by bringing the magnetization directions of the two magnetic layers into a parallel state is smaller than a second write current configured to carry out write by bringing the magnetization directions of the two magnetic layers into an antiparallel state. Furthermore, a first write time needed to carry out write by bringing the magnetization directions of the two magnetic layers into a parallel state is smaller than a second write time needed to carry out write by bringing the magnetization directions of the two magnetic layers into an antiparallel state. By utilizing such characteristics, in this embodiment, both the write operations of a case where "0" data is written, and case where "1" data is written are enabled by a method by which writing is carried out by bringing the magnetization directions of the two magnetic layers into a parallel state.

Figure 4:
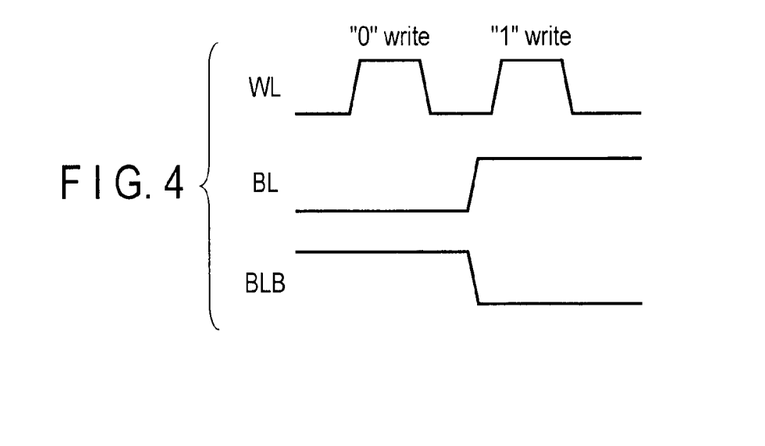
FIG. 4 is a timing chart for explaining a data write operation.
Figure 5A:
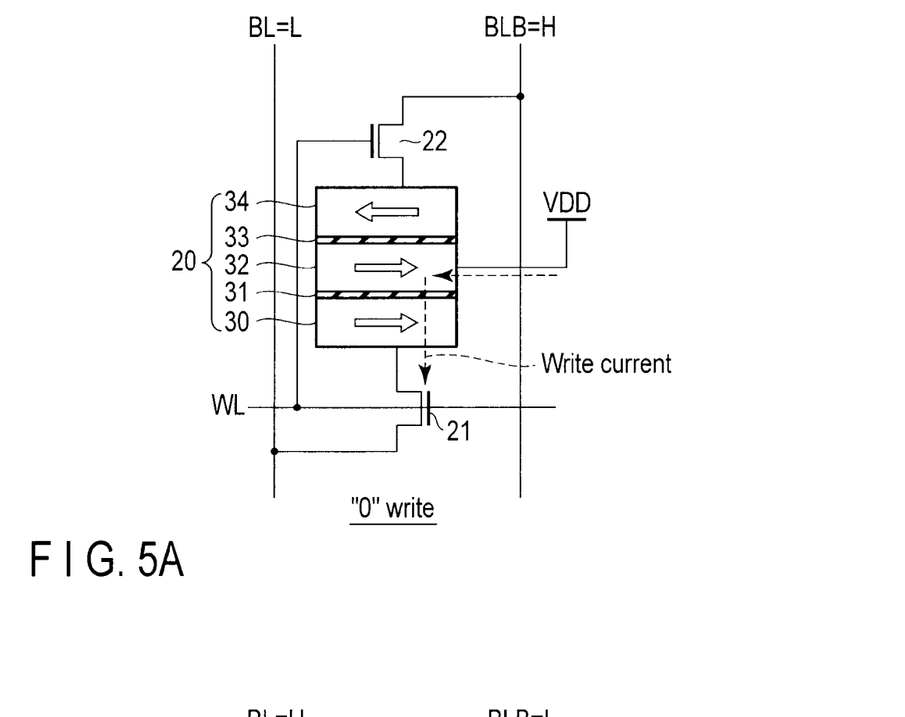
FIGS. 5A and 5B are views for explaining voltage relationships of a write operation.

FIG. 4 is a timing chart for explaining a data write operation. First, a "0" write operation configured to write "0" data to the MTJ element 20 will be described below. FIG. 5A is a view for explaining the voltage relationships of the "0" write operation.

The power-supply voltage VDD is applied to the recording layer 32. The write driver 16 applies the low-level voltage (for example, the ground voltage VSS) to the bit line BL, and applies the high-level voltage (for example, the power-supply voltage VDD) to the bit line BLB. In this state, the row decoder 12 activates the word line WL, i.e., the row decoder 12 applies an on-voltage at which the selection transistors 21 and 22 are turned on, to the word line WL. Thereby, the selection transistors 21 and 22 are turned on.

Then, in the MTJ element 20, a write current flows from the recording layer 32 to the first reference layer 30. This write current makes the magnetization direction of the recording layer 32 coincident with the magnetization direction of the first reference layer 30. At this time, no current flows from the recording layer 32 to the second reference layer 34. The write operation by which the magnetization directions of the recording layer 32, and first reference layer 30 are made parallel with each other is defined as "0" write.

Figure 5B:
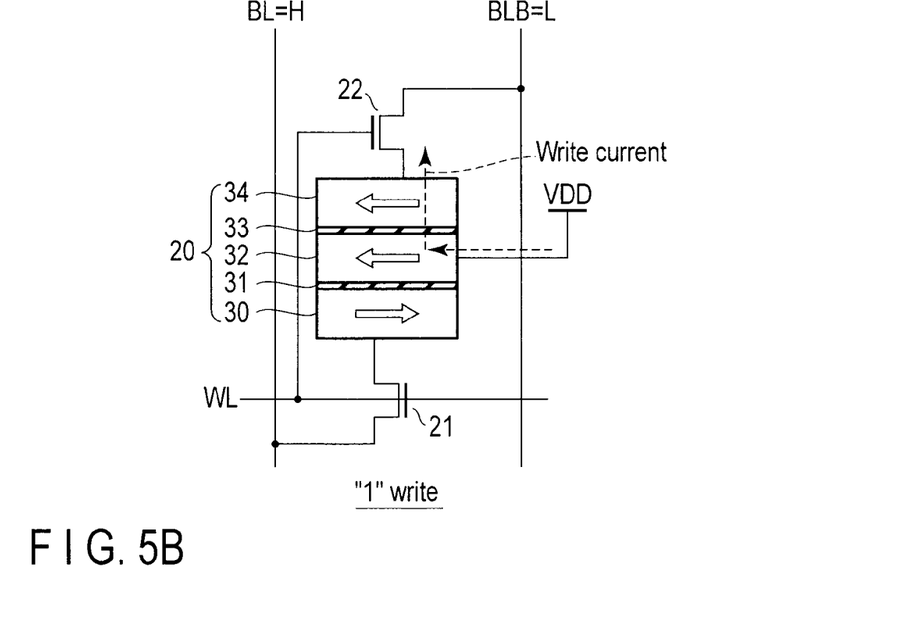

Subsequently, a "1" write operation configured to write "1" data to the MTJ element 20 will be described below. FIG. 5B is a view for explaining the voltage relationships of the "1" write operation.

The power-supply voltage VDD is applied to the recording layer 32. The write driver 16 applies the high-level voltage to the bit line BL, and applies the low-level voltage to the bit line BLB. In this state, the row decoder 12 activates the word line WL. Thereby, the selection transistors 21 and 22 are turned on.

Then, in the MTJ element 20, a write current flows from the recording layer 32 to the second reference layer 34. This write current makes the magnetization direction of the recording layer 32 coincident with the magnetization direction of the second reference layer 34. At this time, no current flows from the recording layer 32 to the first reference layer 30. The write operation by which the magnetization directions of the recording layer 32, and second reference layer 34 are made parallel with each other is defined as "1" write. In the manner described above, 1-bit data can be written to the MTJ element 20.

Figure 6:
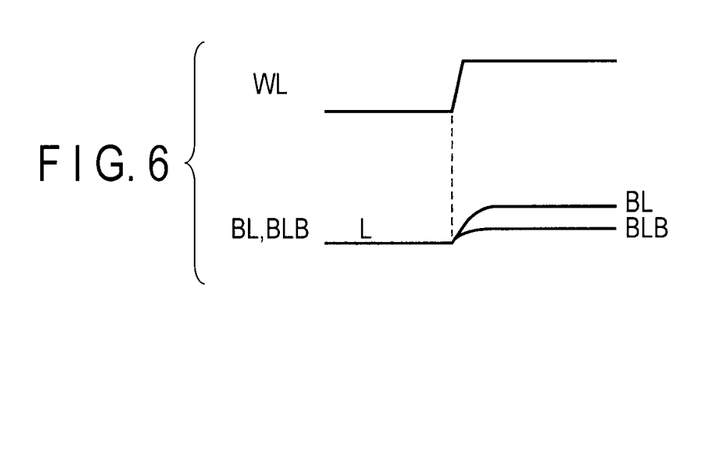
FIG. 6 is a timing chart for explaining a data read operation.
Figure 7:
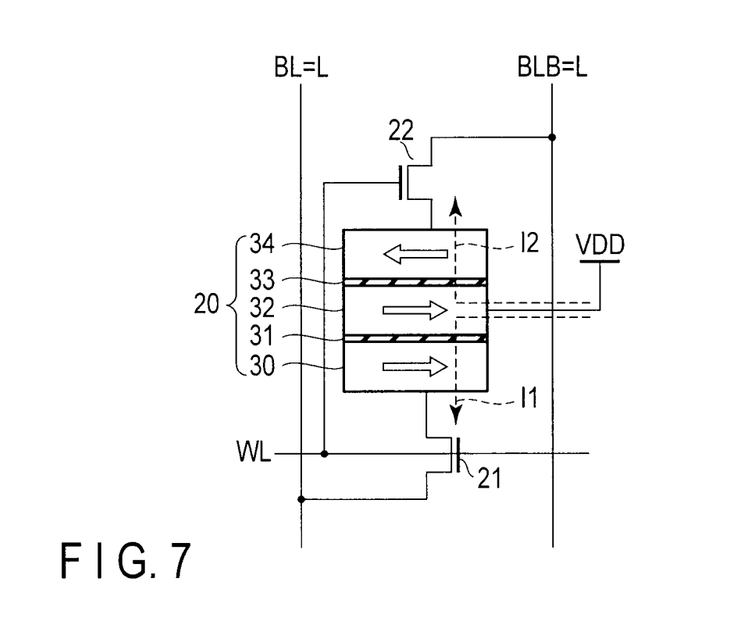
FIG. 7 is a view for explaining voltage relationships of a read operation.

Next, a read operation of the NRAM 10 will be described below. FIG. 6 is a timing chart for explaining the data read operation. FIG. 7 is a view for explaining the voltage relationships of the read operation.

First, the sense amplifier 15 precharges the bit line pair BL and BLB to the low-level voltage. The precharge voltage is not limited to the ground voltage VSS, and may be any voltage lower than the power-supply voltage VDD, i.e., the precharge voltage can be set to an arbitrary voltage as long as the arbitrary voltage satisfies the above condition. In this state, the row decoder 12 activates the word line WL. Thereby, the selection transistors 21 and 22 are turned on.

Then, a read current I1 going through the recording layer 32 and first reference layer 30 flows through the bit line BL. Further, a read current I2 going through the recording layer 32 and second reference layer 34 flows through the bit line BLB.

Here, as shown in FIG. 7, it is assumed that "0" data has been written to the MTJ element 20. That is, the magnetization directions of the recording layer 32 and first reference layer 30 are parallel with each other, and magnetization directions of the recording layer 32 and second reference layer 34 are antiparallel with each other. In this case, the resistance value of the first laminated body constituted of first reference layer 30, first nonmagnetic layer 31, and recording layer 32 is smaller than the resistance value of the second laminated body constituted of the recording layer 32, second nonmagnetic layer 33, and second reference layer 34. A relationship of I1>I2 is obtained and, as shown in FIG. 6, the variation amount of the voltage of the bit line BL becomes greater than the variation amount of the voltage of the bit line BLB with respect to the initial voltage (precharge voltage) of each of the bit line BL, and bit line BLB.

The sense amplifier 15 reads the data from the MTJ element 20 by detecting a voltage difference between the bit line BL and bit line BLB. More specifically, when the variation amount of the voltage of the bit line BL is greater than the variation amount of the voltage of the bit line BLB, the sense amplifier 15 determines that the data is "0" data, and when the variation amount of the voltage of the bit line BL is smaller than the variation amount of the voltage of the bit line BLB, the sense amplifier 15 determines that the data is "1" data. As described above, the sense amplifier executes the differential read.

It should be noted that when "1" data has been written to the MTJ element 20, the magnitude relationship of the bit line pair BL and BLB of FIG. 6 becomes reversed. Further, in the previous description, although the sense amplifier 15 detects the voltage difference between the bit line pair BL and BLB, the detection carried out by the sense amplifier 15 is not limited to the above, and the sense amplifier 15 may detect the difference between currents flowing through the bit line pair BL and BLB.

(Advantage)

As described above in detail, in the first embodiment, the first reference layer 30, first nonmagnetic layer 31, recording layer 32, second nonmagnetic layer 33, and second reference layer 34 are stacked to configure the MTJ element 20, the first reference layer 30 is electrically connected to the bit line BL through the selection transistor 21, and second reference layer 34 is electrically connected to the bit line BLB through the selection transistor 22. Furthermore, the recording layer 32 is electrically connected to a terminal (for example, the power-supply terminal VDD) to which the high-level voltage (upper voltage) is applied. Further, when "0" data is to be written to the MTJ element 20, a write current is made to flow from the power-supply terminal VDD to the bit line BL, and when "1" data is to be written to the MTJ element 20, a write current is made to flow from the power-supply terminal VDD to the bit line BLB.

Therefore, according to the first embodiment, in both the case where "0" data is to be written, and the case where "1" data is to be written, the write current flows from the recording layer to the reference layer. Thereby, it is possible to make the magnitudes of the write currents identical to each other at the time of "0" write, and at the time of "1" write and, further it is possible to make the write times identical to each other. Furthermore, in the write system in which the write current is made to flow from the recording layer to the reference layer, as compared with the system in which the write current is made to flow in the reverse direction, the write current is smaller, and the write time is shorter. Thereby, it becomes possible to reduce the write current, and shorten the write time.

Further, it is possible to make the magnitude of the write current constant at all times while reducing the write current, and hence even when the plurality of selection transistors 21 and 22 vary in characteristics, it is possible to accurately carry out write. Thereby, it is possible to improve the write margin. Further, it is not necessary to set the current drive force of each of the selection transistors 21 and 22 to a large value in order to make it possible to cause a plurality of types of write currents different from each other in the magnitude to flow.

Further, at the time of data read, it is possible to make read currents different from each other in the magnitude to flow in both of the bit line pair BL and BLB. Accordingly, it becomes possible for the sense amplifier 15 to detect the voltage difference or the current difference between the bit line BL, and bit line BLB. That is, in this embodiment, it is possible to realize differential read by the sense amplifier 15. The differential read system is invulnerable to an influence of variation in the power-supply voltage or noise of the signal line. Thereby, it is possible to reduce the misread and, by extension, to improve the read margin.

The recording layer 32 may be electrically connected to a power terminal to which the low-level voltage (the ground voltage VSS) is applied. If the above configuration is realized, a polarity of a voltage of a bit line becomes reversed in each of a write operation and read operation.

Second Embodiment

A second embodiment is a configuration example of an MRAM of a case where P-channel MOSFETs are used as the selection transistors 21 and 22.

Figure 8:
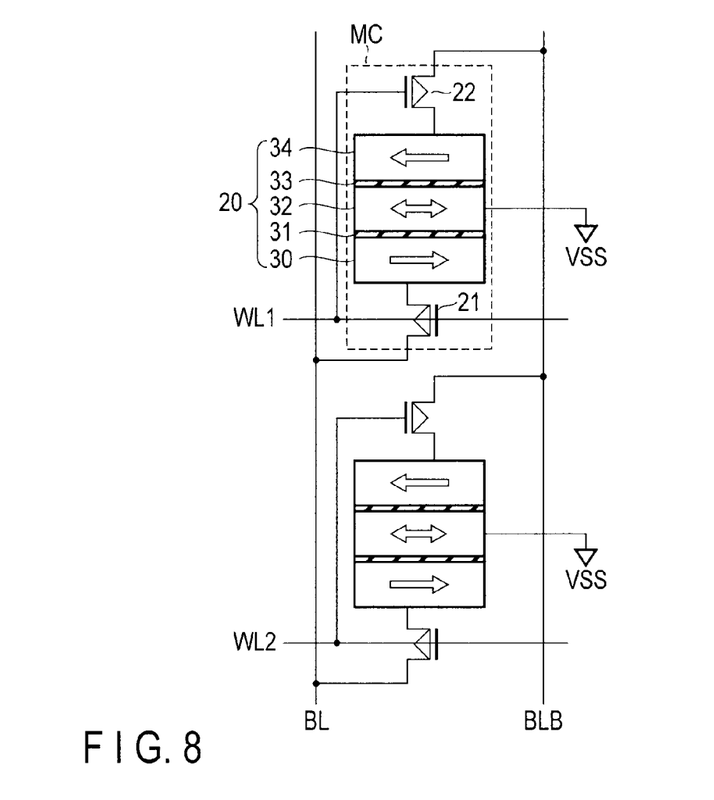
FIG. 8 is a circuit diagram showing the configuration of a memory cell MC according to a second embodiment.

FIG. 8 is a circuit diagram showing the configuration of a memory cell MC according to the second embodiment. The configuration of the MTJ element 20 is identical to the first embodiment.

As selection transistors 21 and 22, P-channel MOSFETs are used. A gate of the selection transistor 21 is electrically connected to a word line WL the source thereof is electrically connected to a bit line BL, and the drain thereof is electrically connected to a first reference layer 30. A gate of the selection transistor 22 is electrically connected to the word line WL, the source thereof is electrically connected to the bit line BLB, and the drain thereof is electrically connected to a second reference layer 34. Furthermore, a recording layer 32 is electrically connected to a power-supply terminal to which a low-level voltage (for example, the ground voltage VSS) is supplied.

(Operation)

Figure 9:
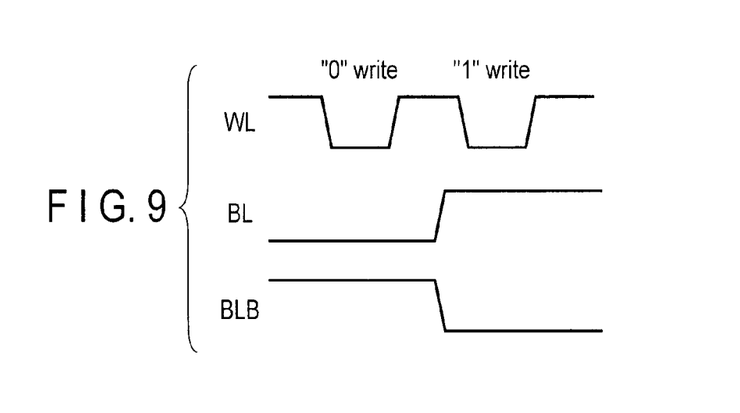
FIG. 9 is a timing chart for explaining a data write operation.
Figure 10A:
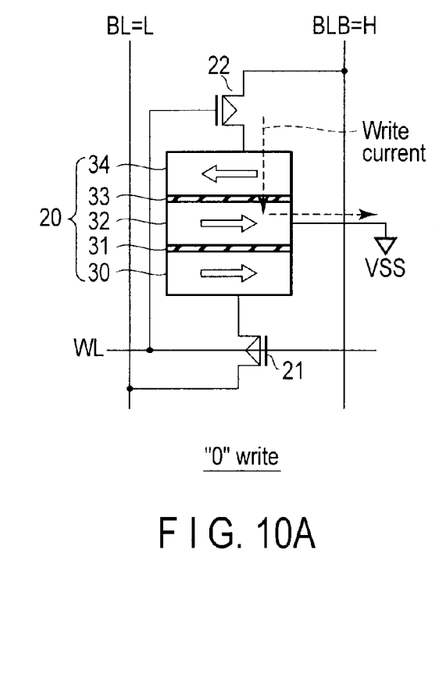
FIGS. 10A and 10B are views for explaining voltage relationships of a write operation.

Next, a write operation of an MRAM 10 will be described below. FIG. 9 is a timing chart for explaining a data write operation. First, a "0" write operation configured to write "0" data to the MTJ element 20 will be described below. FIG. 10A is a view for explaining the voltage relationships of the "0" write operation.

The ground voltage VSS is applied to the recording layer 32. The write driver 16 applies the low-level voltage (for example, the ground voltage VSS) to the bit line BL, and applies the high-level voltage (for example, the power-supply voltage VDD) to the bit line BLB. In this state, the row decoder 12 activates the word line WL. Thereby, the selection transistors 21 and 22 are turned on.

Then, in the MTJ element 20, a write current flows from the second reference layer 34 to the recording layer 32. This write current makes the magnetization direction of the recording layer 32 opposite to the magnetization direction of the second reference layer 34. At this time, no current flows from the first reference layer 30 to recording layer 32. In this way, "0" data is written to the MTJ element 20.

Figure 10B:
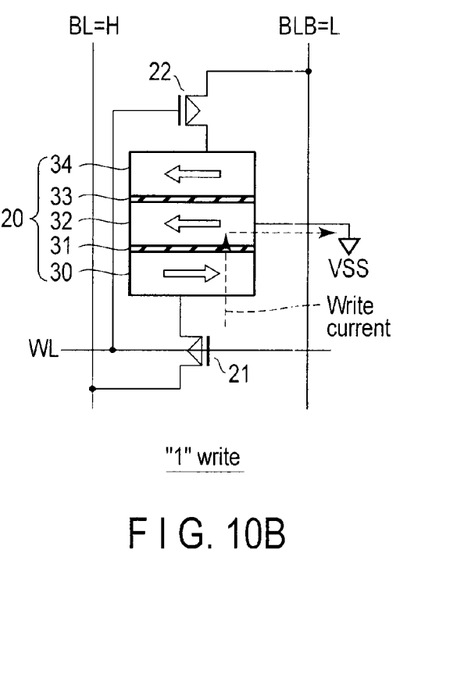

Subsequently, a "1" write operation configured to write "1" data to the MTJ element 20 will be described below. FIG. 10B is a view for explaining the voltage relationships of the "1" write operation.

The ground voltage VSS is applied to the recording layer 32. The write driver 16 applies the high-level voltage to the bit line BL, and applies the low-level voltage to the bit line BLB. In this state, the row decoder 12 activates the word line WL. Thereby, the selection transistors 21 and 22 are turned on.

Then, in the MTJ element 20, a write current flows from the first reference layer 30 to the recording layer 32. This write current makes the magnetization direction of the recording layer 32 opposite to the magnetization direction of the first reference layer 30. At this time, no current flows from the second reference layer 34 to the recording layer 32. In this way, "1" data is written to the MTJ element 20.

Figure 11:
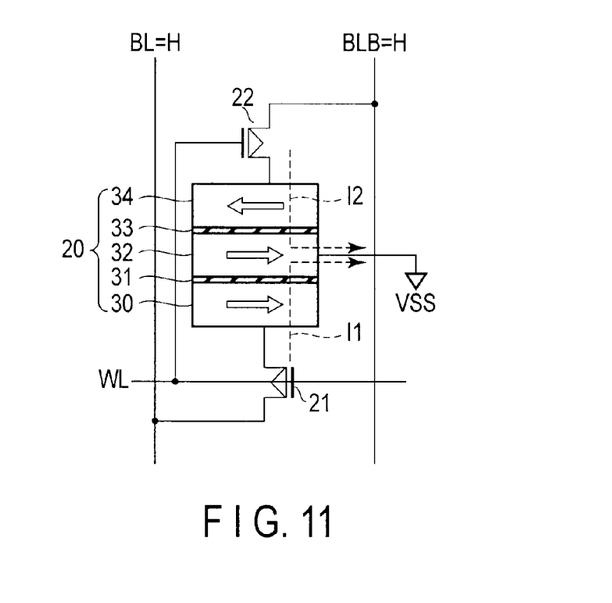
FIG. 11 is a view for explaining voltage relationships of a read operation.

Next, a read operation of the NRAM 10 will be described below. FIG. 11 is a view for explaining the voltage relationships of the read operation.

First, the sense amplifier 15 precharges the bit line pair BL, and BLB to the high-level voltage. The precharge voltage is not limited to the power-supply voltage VDD, and may be any voltage higher than the ground voltage VSS, i.e., the precharge voltage can be set to an arbitrary voltage as long as the arbitrary voltage satisfies the above condition. In this state, the row decoder 12 activates the word line WL. Thereby, the selection transistors 21 and 22 are turned on.

Then, a read current I1 going through the first reference layer 30 and recording layer 32 flows through the bit line BL. Further, a read current I2 going through the second reference layer 34 and recording layer 32 flows through the bit line BLB.

Here, as shown in FIG. 11, it is assumed that "0" data has been written to the MTJ element 20. That is, the magnetization directions of the recording layer 32 and first reference layer 30 are parallel with each other, and magnetization directions of the recording layer 32 and second reference layer 34 are antiparallel with each other. Thus, a relationship of I1>I2 is obtained and, the variation amount of the voltage of the bit line BL becomes greater than the variation amount of the voltage of the bit line BLB with respect to the initial voltage (precharge voltage) of each of the bit line BL, and bit line BLB.

The sense amplifier 15 reads the data from the MTJ element 20 by detecting a voltage difference between the bit line BL and bit line BLB. More specifically, when the variation amount of the voltage of the bit line BL is greater than the variation amount of the voltage of the bit line BLB, the sense amplifier 15 determines that the data is "0" data, and when the variation amount of the voltage of the bit line BL is smaller than the variation amount of the voltage of the bit line BLB, the sense amplifier 15 determines that the data is "1" data. As described above, the sense amplifier executes the differential read.

It should be noted that in the previous description, although the sense amplifier 15 detects the voltage difference between the bit line pair BL and BLB, the detection carried out by the sense amplifier 15 is not limited to the above, and the sense amplifier 15 may detect the difference between currents flowing through the bit line pair BL and BLB.

(Advantage)

As described above in detail, according to the second embodiment, it is possible to configure an MRAM 10 by using P-channel MOSFETs as the selection transistors 21 and 22. Further, it is possible to make the magnitudes of the write currents identical to each other at the time of "0" write and at the time of "1" write, and make the write times identical to each other. Other advantages are identical to the first embodiment.

The recording layer 32 may be electrically connected to a power terminal to which the high-level voltage (the power-supply voltage VDD) is applied. If the above configuration is realized, a polarity of a voltage of a bit line becomes reversed in each of a write operation and read operation.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory comprising:
a magnetoresistive element comprising a first reference layer, a first nonmagnetic layer, a recording layer, a second nonmagnetic layer, and a second reference layer which are sequentially stacked, the recording layer being connected to a terminal to which a high-level voltage is applied, a magnetization direction of the recording layer being variable, magnetization directions of the first and second reference layers being invariable and antiparallel;
a first selection transistor connected between a first bit line and the first reference layer, and constituted of an N-channel MOSFET;
a second selection transistor connected between a second bit line and the second reference layer and constituted of an N-channel MOSFET; and
a word line connected to gates of the first and second selection transistors.

2. The memory of claim 1, further comprising a write circuit configured to
apply a low-level voltage and the high-level voltage to the first bit line and the second bit line, respectively, when first data is to be written to the magnetoresistive element, and,
apply the high-level voltage and the low-level voltage to the first bit line and the second bit line, respectively, when second data is to be written to the magnetoresistive element.

3. The memory of claim 2, wherein
when the first data is to be written to the magnetoresistive element, magnetization directions of the first reference layer and the recording layer are set parallel, and
when the second data is to be written to the magnetoresistive element, magnetization directions of the second reference layer and the recording layer are set parallel.

4. The memory of claim 1, further comprising a sense amplifier configured to precharge the first and second bit lines to a predetermined voltage when reading data.

5. The memory of claim 4, wherein the sense amplifier detects a voltage difference between the first and second bit lines.

6. The memory of claim 1, further comprising a row decoder configured to activate the word line when writing or reading data.

7. The memory of claim 1, wherein
the high-level voltage is a power-supply voltage.

8. The memory of claim 2, wherein
the low-level voltage is a ground voltage.

9. A magnetic memory comprising:
a magnetoresistive element comprising a first reference layer, a first nonmagnetic layer, a recording layer, a second nonmagnetic layer, and a second reference layer which are sequentially stacked, the recording layer being connected to a terminal to which a low-level voltage is applied, a magnetization direction of the recording layer being variable, magnetization directions of the first and second reference layers being invariable and antiparallel;
a first selection transistor connected between a first bit line and the first reference layer, and constituted of a P-channel MOSFET;
a second selection transistor connected between a second bit line and the second reference layer, and constituted of a P-channel MOSFET; and
a word line connected to gates of the first and second selection transistors.

10. The memory of claim 9, further comprising a write circuit configured to
apply the low-level voltage and a high-level voltage to the first bit line and the second bit line, respectively, when first data is to be written to the magnetoresistive element, and,
apply the high-level voltage and the low-level voltage to the first bit line and the second bit line, respectively, when second data is to be written to the magnetoresistive element.

11. The memory of claim 10, wherein
when the first data is to be written to the magnetoresistive element, magnetization directions of the second reference layer and the recording layer are set antiparallel, and
when the second data is to be written to the magnetoresistive element, magnetization directions of the first reference layer and the recording layer are set antiparallel.

12. The memory of claim 9, further comprising a sense amplifier configured to precharge the first and second bit lines to a predetermined voltage when reading data.

13. The memory of claim 12, wherein the sense amplifier detects a voltage difference between the first and second bit lines.

14. The memory of claim 9, further comprising a row decoder configured to activate the word line when writing or reading data.

15. The memory of claim 9, wherein
the low-level voltage is a power-supply voltage.

16. The memory of claim 10, wherein
the high-level voltage is a ground voltage.

* * * * *